(12) United States Patent
Parres

(10) Patent No.: US 10,188,006 B2
(45) Date of Patent: Jan. 22, 2019

(54) BRACKET MOUNT ASSEMBLY FOR LIGHT FIXTURES

(71) Applicant: Minka Lighting, Inc., Corona, CA (US)

(72) Inventor: Miguel Parres, Alta Loma, CA (US)

(73) Assignee: Minka Lighting, Inc., Corona, CA (US)

( * ) Notice: Subject to any disclaimer, the term of this patent is extended or adjusted under 35 U.S.C. 154(b) by 114 days.

(21) Appl. No.: 15/161,801

(22) Filed: May 23, 2016

(65) Prior Publication Data

US 2017/0175960 A1  Jun. 22, 2017

Related U.S. Application Data

(60) Provisional application No. 62/268,484, filed on Dec. 16, 2015.

(51) Int. Cl.
| | |
|---|---|
| *F21V 15/00* | (2015.01) |
| *H05K 5/02* | (2006.01) |
| *F16M 13/02* | (2006.01) |
| *F21V 21/02* | (2006.01) |
| *H02G 3/20* | (2006.01) |
| *F21S 8/00* | (2006.01) |

(52) U.S. Cl.
CPC ......... *H05K 5/0204* (2013.01); *F16M 13/027* (2013.01); *F21V 21/02* (2013.01); *H02G 3/20* (2013.01); *F21S 8/033* (2013.01)

(58) Field of Classification Search
CPC .............. F21S 8/026; F21S 8/02; F21V 21/04
See application file for complete search history.

(56) References Cited

U.S. PATENT DOCUMENTS

| | | | | |
|---|---|---|---|---|
| 5,063,721 | A  * | 11/1991 | Larsson ............... | E04B 2/86 211/106 |
| 2012/0127741 | A1 * | 5/2012 | Osada .................. | F21V 23/006 362/373 |
| 2015/0198324 | A1 * | 7/2015 | O'Brien ............. | F21V 33/0052 362/294 |
| 2015/0338071 | A1 * | 11/2015 | Feit ........................ | F21V 21/04 362/370 |

FOREIGN PATENT DOCUMENTS

CN 204648027 * 9/2015

OTHER PUBLICATIONS

English Machine translation of Liu CN 204648027, Sep. 16, 2015.*

* cited by examiner

*Primary Examiner* — Evan Dzierzynski
(74) *Attorney, Agent, or Firm* — Baker & McKenzie LLP

(57) ABSTRACT

A bracket mount assembly includes a mounting plate and a base assembly. The mounting plate includes a mounting aperture. The mounting aperture has an aperture cross-sectional width. The base assembly includes a first fastener and a second fastener. A first width is defined as a width between the first and second fasteners proximal to a first end of the base assembly. A second width is defined as a width between the first and second fasteners proximal to a second, opposing end of the primary fastener. A third width is defined as a width between the first and second fasteners at a point between the first and second ends of the primary fastener. The third width is greater than each of the first width, the second width and the aperture cross-sectional width.

18 Claims, 9 Drawing Sheets

BRACKET MOUNT ASSEMBLY FOR LIGHT FIXTURES

CROSS REFERENCE TO RELATED APPLICATIONS

This application claims priority to U.S. Provisional App. No. 62/268,484, filed on Dec. 16, 2015, which is incorporated by reference in its entirety.

BACKGROUND

Lights, ceiling fans, and other fixtures are typically mounted to an electrical outlet box of a wall, ceiling or other support structures. The structure's electrical system may then be connected to the fixture by routing wires through the outlet box and connecting it to the fixture.

A common type of a bracket to mount the fixture to the electrical outlet box contains a mounting plate attached across the opening of the electrical outlet box by threaded connectors such as screws. The fixture is then coupled to the electrical outlet box by screws inserted through the fixture and into threaded holes on the mounting plate. This method of installation is difficult to perform, as the fixture often blocks the view of the threaded holes on the mounting plate, and workers need to scrape the screws around the mounting plate to locate the threaded holes. Furthermore, certain fixtures, such as recessed lights, must be installed in tight quarters where visibility or dexterity are limited. Because of this, there is a need to improve installation of light fixtures.

BRIEF SUMMARY

In an exemplary embodiment, a bracket mount assembly includes a mounting plate and a base assembly. The mounting plate includes a mounting aperture. The mounting aperture has an aperture cross-sectional width. The base assembly includes a first fastener and a second fastener. A first width is defined as a width between the first and second fasteners proximal to a first end of the base assembly. A second width is defined as a width between the first and second fasteners proximal to a second, opposing end of the primary fastener. A third width is defined as a width between the first and second fasteners at a point between the first and second ends of the primary fastener. The third width is greater than each of the first width, the second width and the aperture cross-sectional width.

In another exemplary embodiment, a bracket mount assembly includes a base assembly and a mounting plate. The base assembly includes a first fastener, a second fastener, and a base plate that couples to a fixture. The mounting plate includes a first fastening member, a second fastening member and a mounting aperture disposed between the first and second fastening members. A cross-sectional width of the mounting aperture is less than a width between the first and second fasteners. The fastening members respectively include a top portion, a middle portion, and a bottom portion. The top portion has a top width, the middle portion has a middle width, and the bottom portion has bottom width. The middle width is greater than each of the top width and the bottom width.

In another exemplary embodiment, a method of coupling a fixture to a support structure includes: providing a base assembly having a first fastener and a second fastener; providing a hanger assembly having a first fastener, a second fastener, and a mounting aperture with an aperture cross-sectional width; coupling the first and second fasteners of the hanger assembly to a support structure; and coupling the base assembly to the hanger assembly by inserting the first and second fasteners of the base assembly into the mounting aperture of the hanger assembly.

BRIEF DESCRIPTION OF THE DRAWINGS

For a better understanding of the aforementioned embodiments as well as additional embodiments thereof, reference should be made to the Detailed Description below, in conjunction with the following drawings in which like reference numerals refer to corresponding parts throughout the figures.

DETAILED DESCRIPTION

Reference will now be made in detail to embodiments, examples of which are illustrated in the accompanying drawings and figures. In the following detailed description, numerous specific details are set forth in order to provide a thorough understanding of the invention. However, it will be apparent to one of ordinary skill in the art that the invention may be practiced without these specific details. In other instances, well-known methods, procedures, components, circuits and networks have not been described in detail so as not to unnecessarily obscure aspects of the embodiments.

It will also be understood that, although the terms first, second, etc., may be used herein to describe various elements, these elements should not be limited by these terms. These terms are used to distinguish one element from another. For example, a first object or step could be termed a second object or step, and, similarly, a second object or step could be termed a first object or step, without departing from the scope of the invention. The first object or step, and the second object or step, are both objects or steps, respectively, but they are not to be considered the same object or step.

The terminology used in the description of the invention herein is for the purpose of describing particular embodiments and is not intended to be limiting of the invention. As used in the description of the invention and the appended claims, the singular forms "a," "an" and "the" are intended to include the plural forms as well, unless the context clearly indicates otherwise. It will also be understood that the term "and/or" as used herein refers to and encompasses any possible combination of one or more of the associated listed items. It will be further understood that the terms "includes," "including," "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "if" may be construed to mean "when" or "upon" or "in response to determining" or "in response to detecting," depending on the context.

Those with skill in the art will appreciate that while some terms in this disclosure may refer to absolutes, e.g., all of the components of a bracket mount, each of a plurality of apertures, etc., the methods and techniques disclosed herein may also be performed on fewer than all of a given thing, e.g., performed on one or more components. Accordingly, in instances in the disclosure where an absolute is used, the disclosure may also be interpreted to be referring to a subset.

Figure 1:
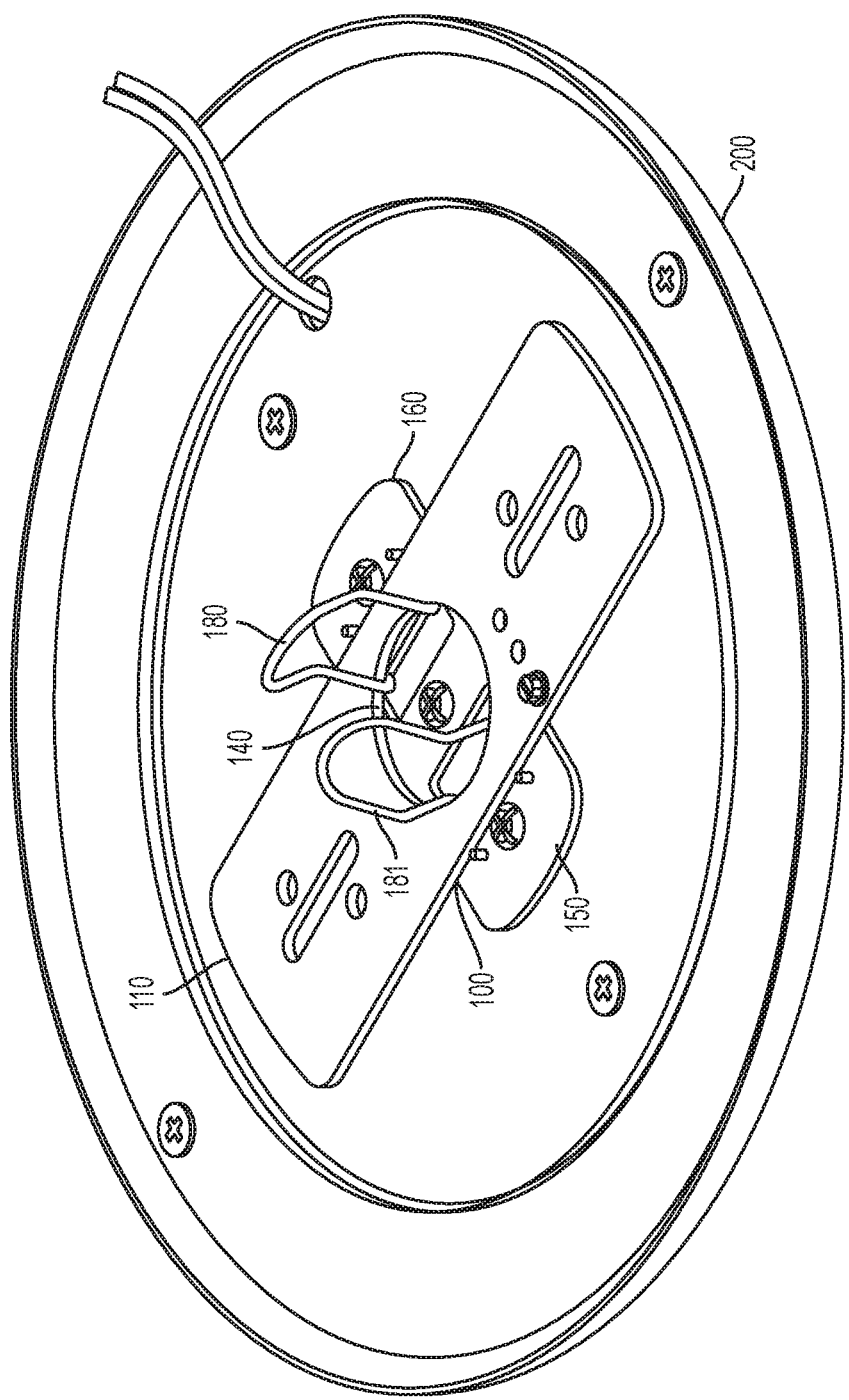
FIG. 1 illustrates a perspective view of an exemplary bracket mount assembly and light fixture.

FIG. 1 illustrates a perspective view of a bracket mount assembly 100 attached to a fixture 200. The bracket mount assembly 100 includes a mounting plate 110 and a base assembly 150. The mounting plate 110 includes a mounting aperture 140. The base assembly 150 includes first fastener 180, second fastener 181 and base plate 160. The base plate 160 may be secured to the fixture 200. The base assembly 150 is coupled to the mounting plate 110 by the first fastener 180 and second fastener 181 inserted through the mounting aperture 140.

Figure 2:
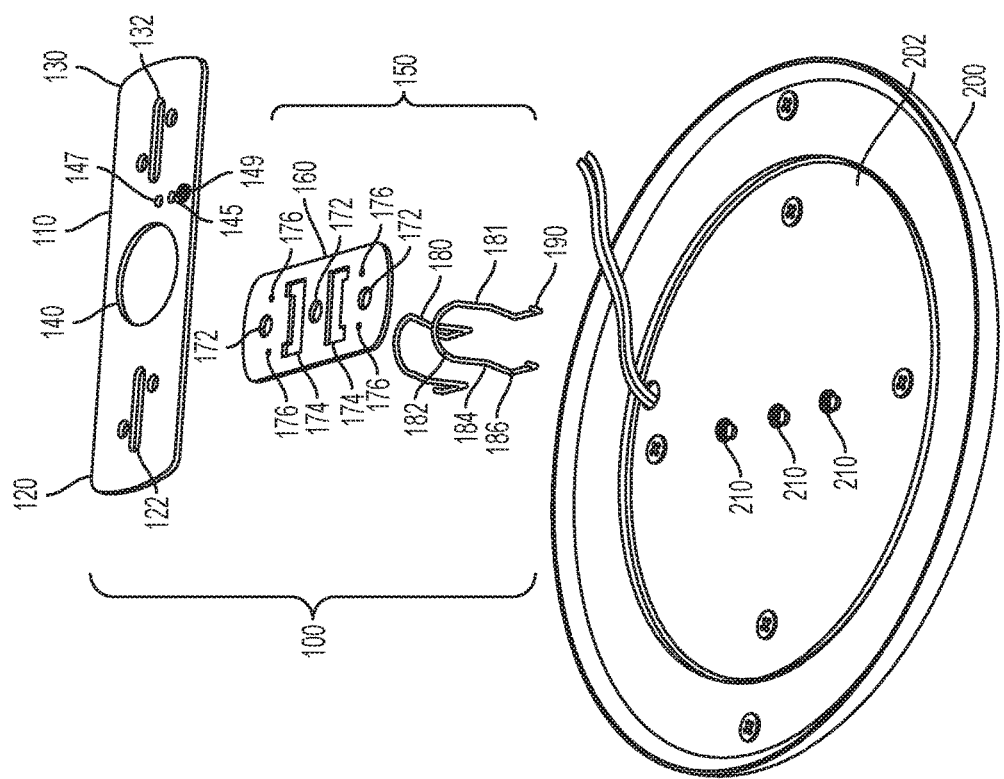
FIG. 2 illustrates an exploded perspective view of an exemplary bracket mount assembly and light fixture.

FIG. 2 illustrates an exploded perspective view including the bracket mount assembly 100 and fixture 200. The bracket mount assembly 100 includes mounting plate 110, base plate 160, first fastener 180 and second fastener 181. The mounting plate 110 includes a first end 120 and second end 130. One or more first openings 122 are located on the mounting plate 110 near the first end 120, and one or more second openings 132 are located on the mounting plate 110 near the second end 130.

The mounting plate 110 also includes a mounting aperture 140, which may be circular or take other shapes. If circular, the circular mounting aperture 140 may be referred to as having a first diameter. If the mounting aperture 140 takes another shape, it may be refereed to as having a first width. It will be appreciated that any shape may be referred to as having either a diameter or a width. The mounting aperture 140 may also include a plurality of separate apertures, the separate apertures forming a shape with a first diameter or first width. The mounting aperture 140 may be disposed at a center of the mounting plate 110.

The mounting plate 110 may include a grounding mechanism 145. The grounding mechanism 145 may include one or more grounding apertures 147 that engage one or more grounding attachments 149. The mounting plate 110 may be rectangular in shape so as to fit a square or rectangular electrical box. The edge of the first end 120 and second end 130 of the mounting plate 110 may be rounded to fit a rounded electrical box or complement the shape of round light fixtures.

The base assembly 150 includes a first fastener 180, a second fastener 181, and a base plate 160. The base plate 160 includes two ends and a center portion, each of which may have one or more openings, holes, slots, or apertures of any shape. A first set of such openings 172 may engage fixture fasteners 210 to secure the base plate onto the fixture 200. A second and third set of such openings 174 and 176 may be used to secure the fasteners 180 and 181 to the fixture 200.

The first fastener 180 and the second fastener 181 may engage the mounting plate 110 and secure the base assembly 150 to the mounting plate 110. Both fasteners 180 and 181 may respectively include top 182, middle 184, and bottom 186 portions, and may be inserted into the mounting aperture 140 of the mounting plate 110. In a particular example, the top 182, middle 184, and bottom 186 portions of the fasteners 180 and 181 form a rhombic shape. The fasteners 180 and 181 are bent outwards at an angle away from the center of the base plate 160 from the bottom portions 186 towards the middle portions 184, while the fasteners 180 and 181 are bent inwards from the middle portions 184 towards the top portions 182. The middle portions 184 of the fasteners 180 and 181 have a width that is greater than the width between the bottom portions 186. This smaller width at the bottom portions 186 may help to hold the mounting plate 110 towards the base plate 160. The middle portions 184 of the fasteners 180 and 181 may also have a width that is greater than the width between the top portions 182. This smaller width at the top portions 182 may make it easier to insert the fasteners 180 and 181 into the mounting aperture 140. In addition, the width of the middle portions 184 may be greater than the first diameter (width) of the mounting aperture 140. The bottom portions 186 may have a width that is equal to or slightly less than the first diameter of the mounting aperture 140. The top portions 182 of the fasteners 180 and 181 may be tapered or rounded to allow for smoother installation.

In a particular example, the first fastener 180 and second fastener 181 are bent wires. The fasteners 180 and 181 may be secured to the base plate 160, for example by welding. Alternatively, the fasteners 180 and 181 may be disposed through the second set of openings 174 in the base plate 160. Grooves within the second set of openings 174 may secure the bottom portions 186 of the fasteners 180 and 181 in place. The end portions 190 of the fasteners 180 and 181 may also be secured onto the third set of openings 176 of the base plate 160. Alternatively, the base plate may be omitted, and the fasteners 180 and 181 may be integrated directly onto a recessed top surface 202 of the fixture 200. It will also be appreciated that the first and second fasteners 180 and 181 may be provided as an integral or unitary part.

Figure 3:
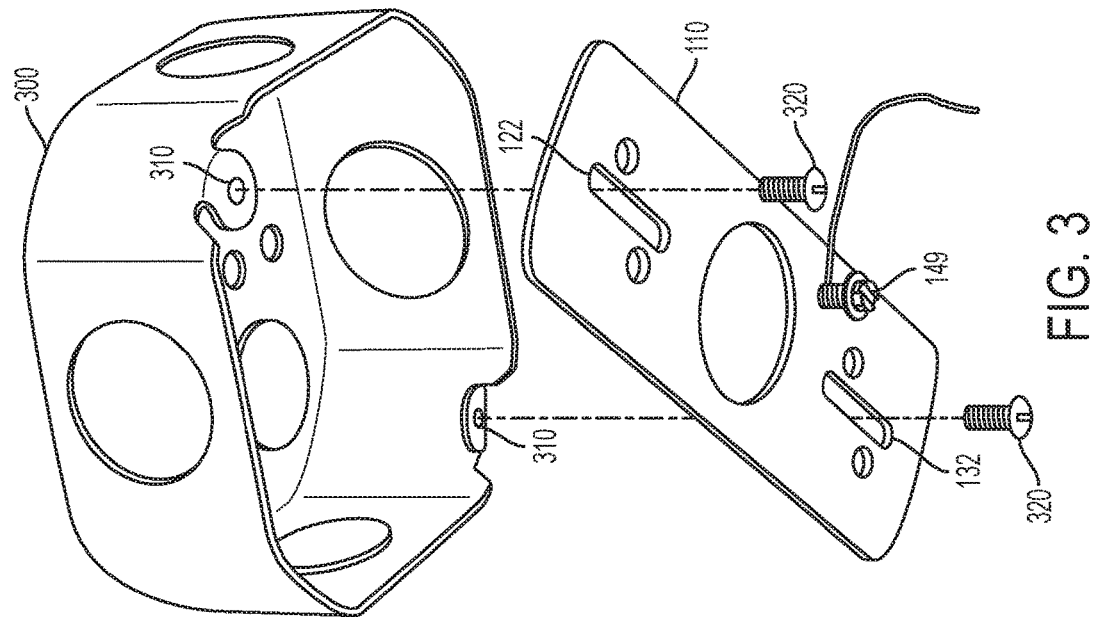
FIG. 3 illustrates an exploded perspective view of an exemplary mounting plate and support structure.

FIG. 3 illustrates an exploded perspective view of the mounting plate 110 connecting to a support structure 300. In a particular example, the support structure 300 is an electrical outlet box (e.g., a square receptacle) with openings 310 to receive fasteners 320. The mounting plate 110 may be coupled to the support structure 300 by inserting fasteners 320 through the apertures 122 and 132 of the mounting plate 110 and securing the fasteners 320 into openings 310 of the support structure 300.

Figure 4:
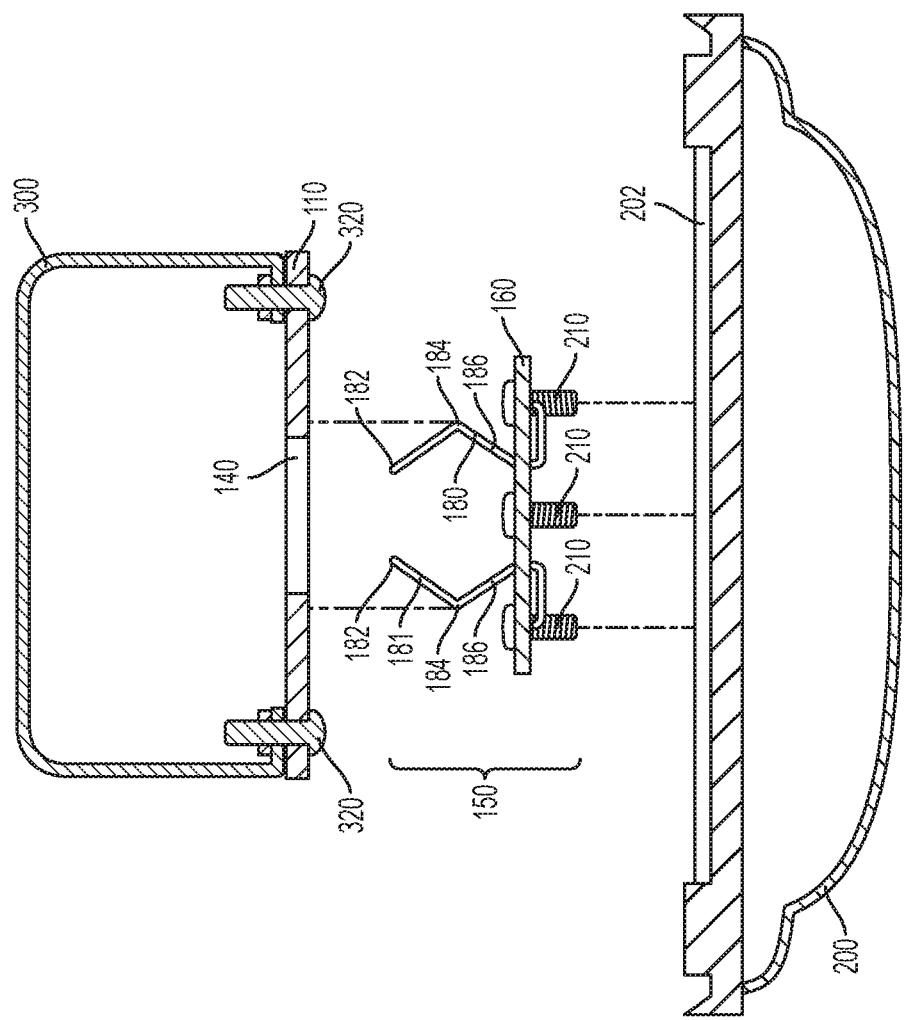
FIG. 4 illustrates an exploded cross-sectional view of an exemplary bracket mount assembly, light fixture and support structure.

FIG. 4 illustrates an exploded cross-sectional view of the bracket mount assembly where mounting plate 110 is coupled to the support structure 300. The base assembly 150 may be attached to the recessed top surface 202 of the fixture 200 via fixture fasteners 210. The base assembly 150 may be secured onto the mounting plate 110 by pushing the fasteners 180 and 181 into the mounting aperture 140 of the mounting plate 110. The rhombic shape of the fasteners 180 and 181 facilitates the top portions 182 to be easily inserted into the mounting aperture 140. The middle portions 184 of the fasteners 180 and 181 have a width larger than the diameter of the mounting aperture 140 such that moderate pressure applied to the fixture 200 may insert the fasteners 180 and 181. While pressure is applied, the middle portions 184 of the fasteners 180 and 181 are displaced towards the center of the base plate 160, thus decreasing the cross-sectional width of the middle portions 184. When enough force is applied, the middle portions 184 will pass through the mounting aperture 140 of the mounting plate 110, and expand back towards their original shape. The fasteners 180 and 181 may operate like a spring being pressed together to pass through the mounting aperture 140 and exerting a spring force operable to spread the fasteners 180 and 181 apart. The spring force of the fasteners 180 and 181, together with the width of the middle portions 184 being greater than the width of the bottom portions 186, secures the bottom portions 186 of the fasteners 180 and 181 to the mounting plate. The fixture 200 may not be heavy enough to pull the middle portions 184 of the fasteners 180 and 181 through the mounting aperture 140 to detach the fasteners 180 and 181.

Figure 5:
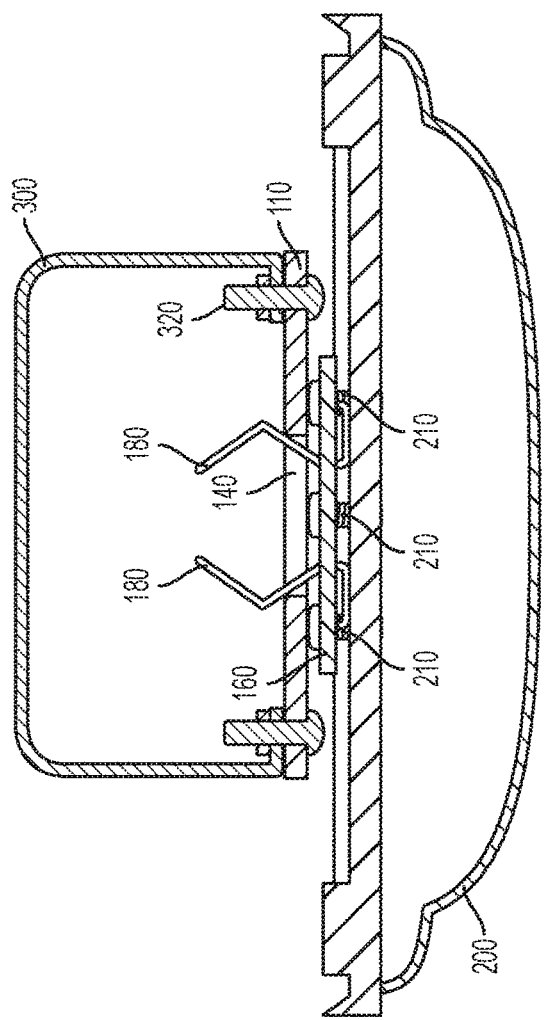
FIG. 5 illustrates a cross-sectional view of an assembled exemplary bracket mount assembly, light fixture and support structure.

FIG. 5 illustrates a cross-sectional view of an assembled bracket mount assembly connecting fixture 200 to support structure 300. The support structure 300 may be coupled to the mounting plate 110 via the fasteners 320. The mounting plate 110 may be coupled to the base plate 160 via fasteners 180 and 181. The base plate 160 may be secured to the fixture 200 via fasteners 210. Although the fasteners 320 and 210 in FIG. 5 are shown as screws, they may be a hook, clasp, welding, or by any other fastening devices.

Figure 6:
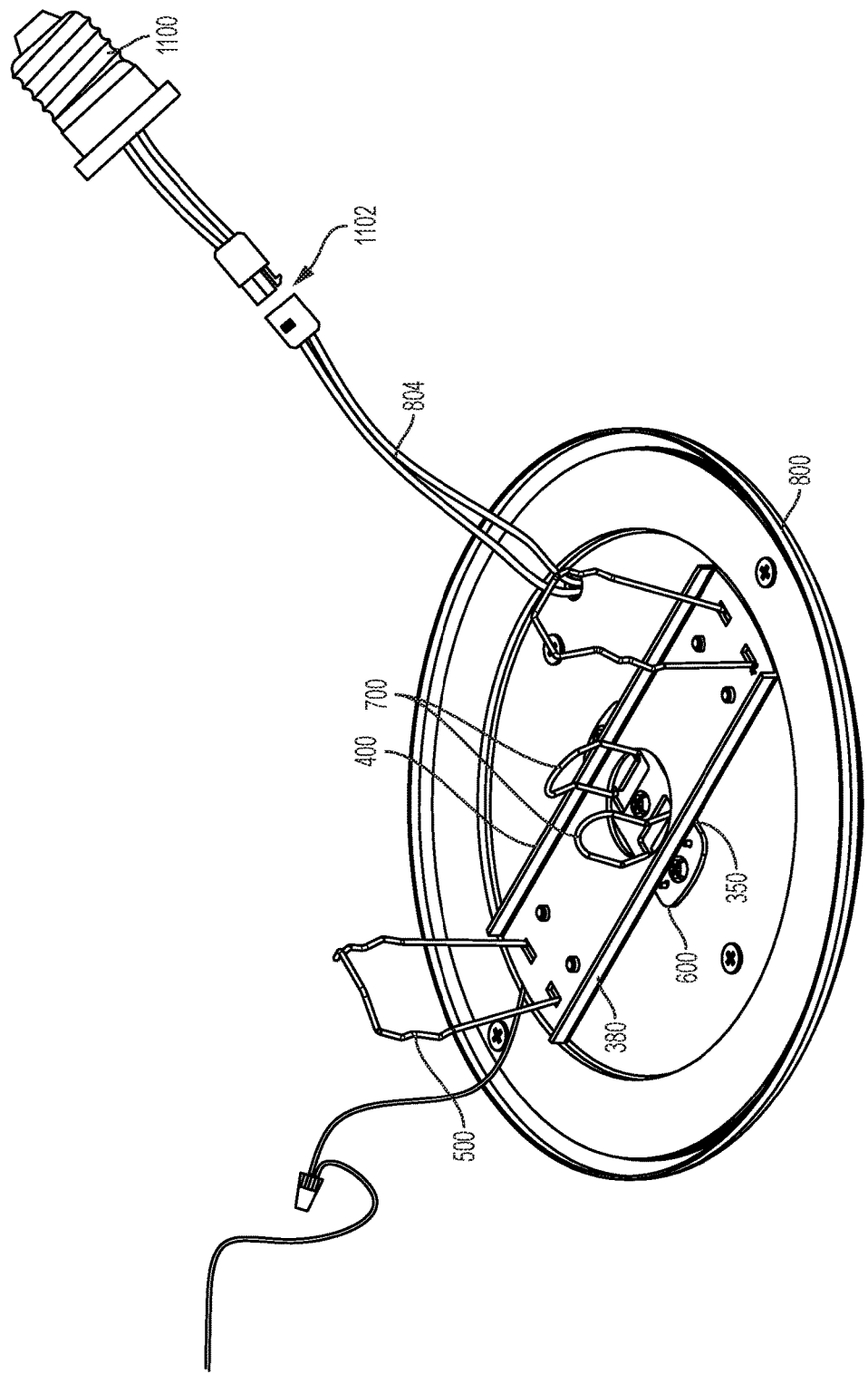
FIG. 6 illustrates a perspective view of an exemplary bracket mount assembly and light fixture.

FIG. 6 illustrates a perspective view of a bracket mount assembly 350 coupled to a fixture 800. The bracket mount assembly 350 includes a hanger bracket assembly 380, a base plate 600, and fasteners 700. The hanger bracket assembly 380 may include a mounting plate 400 and one or more fastening members 500. The fastening members 500 may be coupled to a support structure (discussed in more detail below). The fixture 800 may be a light fixture, and electrical wires 804 for the light fixture may be connected to a screw type socket adapter 1100 to facilitate connection with a support structure that includes a screw type base. The adapter 1100 may include a quick disconnect 1102 for easier connection to the wires 804. The adapter 1100 may remove the need for wire nuts and provide for a simpler installation procedure.

Figure 7:
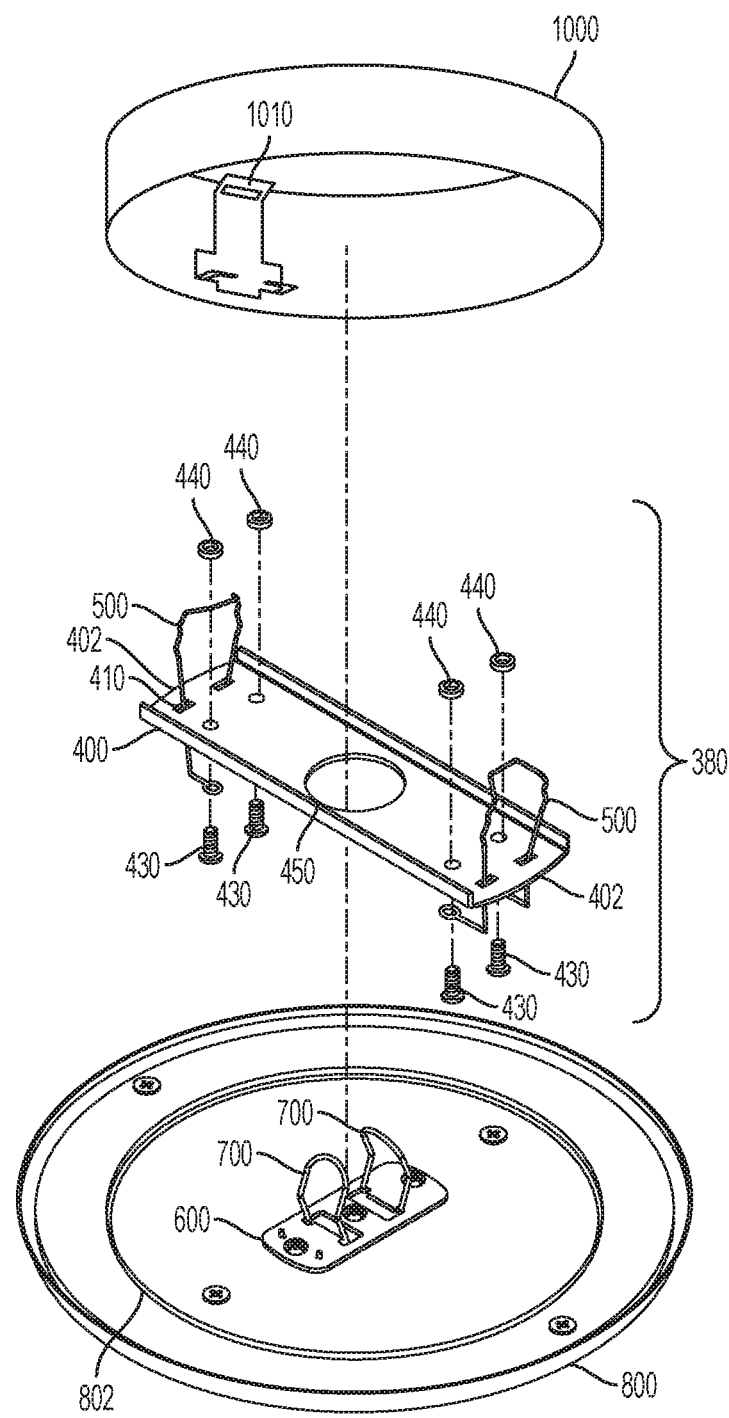
FIG. 7 illustrates an exploded perspective view of an exemplary hanger bracket assembly, light fixture and support structure.

FIG. 7 illustrates an exploded perspective view of the hanger bracket assembly 380, the fixture 800, and a support structure 1000. The bracket mount assembly includes a mounting plate 400 and one or more fastening members 500. The mounting plate 400 includes a mounting aperture 450, and may be a horizontal crossbar substantially rectangular in shape. In a particular example, the edges 402 at ends of the mounting plate 400 are arcuate, for example, rounded. These rounded edges may conform and correspond to a curvature of the edge of a recessed top surface 802 of the fixture 800. The rounded edges may also be complementary to a round shape of the support structure 1000. The mounting plate 400 may fit inside the recessed top surface 802 within the fixture 800, where the diameter of the recessed top surface 802 is equal to or slightly greater than the length of the mounting plate 400. The mounting plate 400 may also have a length less than a diameter of the support structure 1000. For example, if a support structure 1000 has a diameter of 6", the mounting plate 400 may have a diameter of 5.75".

A fastening member 500 may be coupled to the mounting plate, for example, by welding. The fastening member 500 may also be disposed through a set of openings 410 at the end portion of the mounting plate 400 and secured by fasteners 430 and nuts 440.

The base plate 600 and fasteners 700 may be secured to the fixture 800 in a manner similar to the base plate 160 and fasteners 180 and 181 discussed above with respect to FIGS. 2 and 3. The fasteners 700 may be coupled to the mounting aperture 450 so as to attach the fixture 800 to the mounting plate 400. Similar to the embodiment discussed above referring to FIGS. 1-5, the mounting aperture 450 may have a large diameter that is easy to locate, for example at least as large as a person's fingertip—e.g., 1 cm or greater. Even if the fixture 800 blocks the view of the mounting plate 400, a worker can easily locate the mounting aperture 450 to insert the fasteners 700. In addition, no separate tools are necessary to mount the fixture. The fasteners 700 need not be threaded, and can be secured by pushing them through the mounting aperture 450. The requirement to use screwdrivers or wrenches in tight spaces where visibility or dexterity is limited may also be avoided when installing fixtures such as recessed lighting fixtures.

The support structure 1000 may be any type of housing structure used to provide the fixture 800 with electricity and support. In a particular example, the support structure 1000 is a recessed light can/receptacle housing and the fixture 800 is a light fixture. The support structure 1000 may contain openings, holes, slots, hooks, apertures or any appropriate mechanisms to couple to fastening members 500. In a particular example, the support structure 1000 includes a securing mechanism 1010 to couple to the fastening member 500.

Figure 8:
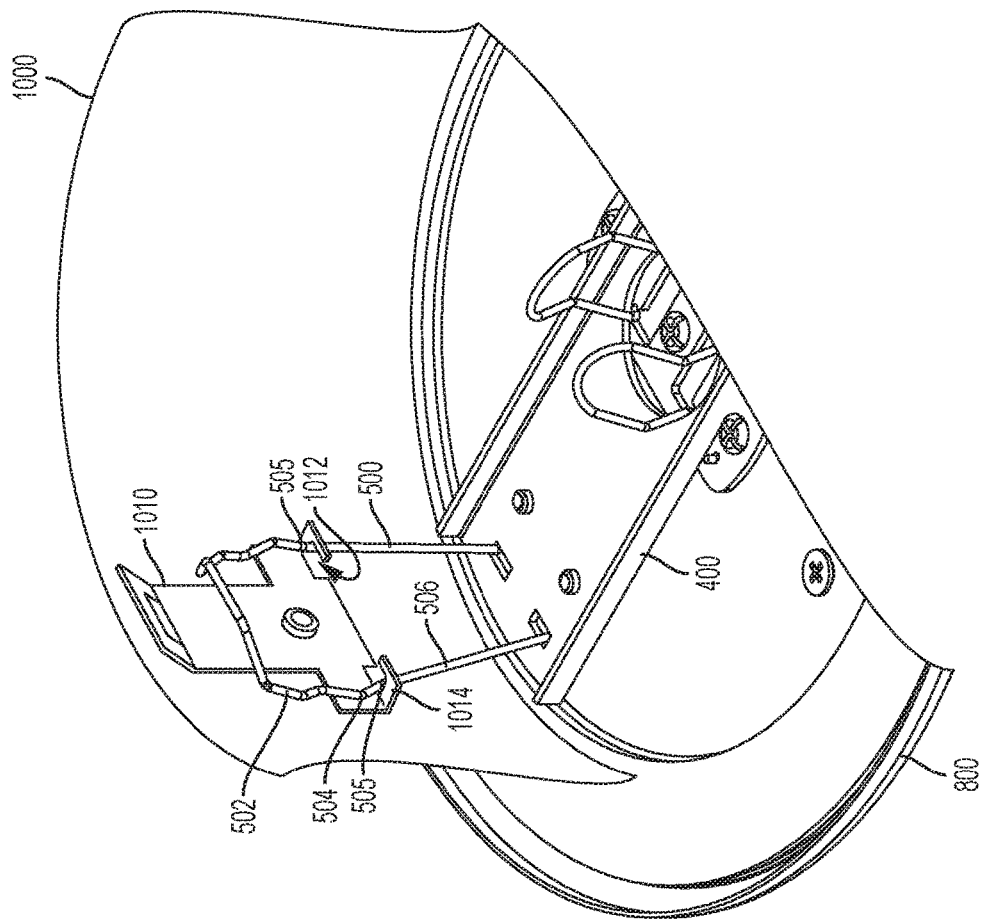
FIG. 8 illustrates a partial perspective view of an exemplary bracket mount assembly, light fixture and support structure.

FIG. 8 illustrates a partial perspective view of the fastening member 500 coupled to the securing mechanism 1010 within the support structure 1000. In a particular example, the fastening member 500 is rhombic in shape and includes top 502, middle 504, and bottom 506 portions. The middle portion 504 of the fastening member 500 may have a middle width that is greater than a top width of the top portion 502 and a bottom width of the bottom portion 506. The securing mechanism 1010 may include an opening 1012. The opening 1012 has a width that is less than the middle width of the fastening member 500 at the middle portion 504.

The fastening member 500 is inserted into the opening 1012 to couple the fastening member 500 to the securing mechanism 1010. Since the width of the middle portion 504 is greater than the width of the opening 1012, the middle portion 504 of the fastening member may rest on the edges of the opening 1012 and secure the fastening member 500 in place unless the fixture 800 is pulled with sufficient force to detach it. The fastening member 500 may operate like a spring being pressed together to pass through the hole and exert a spring force operable to spread the fastening member 500 apart. The spring force together with the width of the middle portion 504 being greater than the width of the bottom portion 506 causes the fastening member 500 to be pulled upwards and held to the opening 1012 of the securing mechanism 1010.

In a particular example, the middle portion 504 is an outward protrusion of the fastening member 500. The protruding middle portion 504 may meet the bottom portion 506 of the fastening member 500 at an angled joint 505. When the angled joint 505 is latched to the edge of the opening 1012, the fastening member 500 is secured onto the securing mechanism 1010 because the weight of the fixture 800 is not sufficient to pull the protruding middle portion 504 through the opening 1012.

Figure 9:
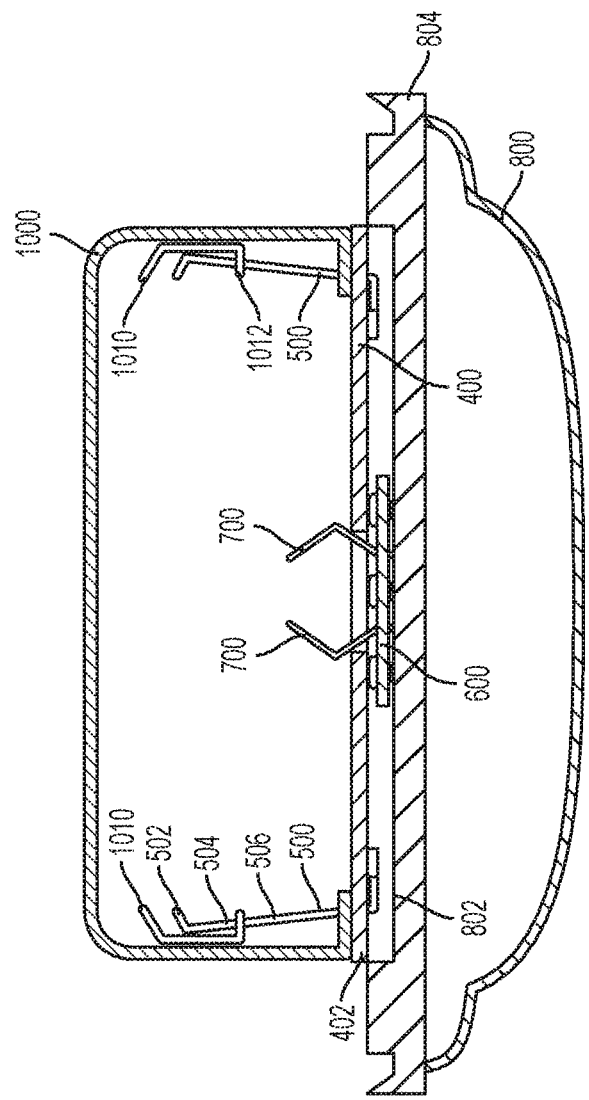
FIG. 9 illustrates a cross-sectional view of an assembly coupling a light fixture and support structure.

FIG. 9 illustrates a cross-sectional view of an assembly coupling the support structure 1000 to the light fixture 800. The support structure 1000 includes securing mechanisms 1010 having openings 1012. The fastening members 500 are secured to the securing mechanisms 1010, for example by inserting the fastening members 500 into the openings 1012. The middle portions 504 of the fastening members 500 are disposed on top of the openings 1012. The fastening members 500 are further coupled to the mounting plate 400. The mounting plate 400 is coupled to the base plate 600 via fasteners 700, and the base plate 600 is coupled to the top surface 802 of fixture 800. The top surface 802 is preferably recessed of such a depth that the bracket mount assembly may be hidden by the edge 804 of the fixture 800 and not visible to those looking at the light fixture after installation.

It will be appreciated that fastening members 500 may be provided by clasps, hangers, or any other mechanism that engages the securing mechanism 1010. Additionally, the opening 1012 may be omitted. For example, a securing hanger (e.g., a protrusion such as a hook shaped protrusion) may be employed. The fastening members 500 may engage the securing hanger to couple the mounting plate to the receptacle.

In a particular example, the fastening member 500 may include additional locking members to facilitate securing the mounting plate 400 to the support structure 1000. The locking members may be in the form of protrusions or hooks, and may be located between the middle 504 and top 502 portions, or any other suitable location.

The fastening members 500 need not be disposed perpendicularly to the mounting plate 400. In a particular example shown in FIGS. 8 and 9, the fastening members 500 angle away from the center of the mounting plate 400. The top portions 502 of the fastening members 500 may extend past the edge 402 of the mounting plate 400. This angling away of the fastening members 500 may exert an additional outward spring force against the securing mechanism 1010 and walls of support structure 1000 so as to improve securing the mounting plate 400 (and thereby also the fixture 800) onto the support structure 1000.

In an example, the fastening members 500 may be bent wires. The fastening members 500 may also be a hooking mechanism, operable to hook into a hole or slot of the securing mechanism 1010 or support structure 1000. In a particular example, fastening members 500 may be of adjustable length so as to secure the mounting plate 400 at a desirable distance from the support structure 1000.

Examples of fasteners have been provided in this disclosure. However, those with skill in the art will appreciate that variations of these fasteners and alternative forms that can be derived from the example fasteners provided herein may also be successfully used to perform the apparatus related to the embodiments disclosed herein.

Any of the above disclosed mounting plates may be circular, rectangular, square, oval, or of any appropriate shape that correspond in shape and size to the recessed top surface of the fixture. The disclosed mounting apertures may also be circular, rectangular, square, oval, or of any appropriate shape or size to receive fasteners coupled to the fixture. Mounting plates may also include openings at any appropriate locations to receive fasteners with which to attach to a support structure. The openings may include the mounting aperture, or any other opening at any appropriate location on the mounting plates. The fastening elements coupling the mounting plates and the support structure maybe a screw, hook, clasp or adjustable rod.

In a particular example, the base plate may be secured onto the recessed top surface of the fixture by welding. Fasteners attached to the base plate may be hooks, clasps, screws, rods, or any other appropriate fastening means. Fasteners may also be attached to the recessed top surface of the fixture without the usage of a base plate.

A method to install a fixture 200 to a support structure 300 using a bracket mount 100 assembly shown in FIGS. 1-5 is discussed below. A worker may install the mounting plate 110 onto the support structure 300 by inserting the fasteners 320 through the openings 122 and 132 of the mounting plate 110 and securing the fasteners 320 into openings 310 of the support structure 300. For example, the openings may be threaded to accommodate the fasteners 320 or another mechanism such as a nut may be used to secure the fasteners 320 to the support structure 320 via the openings 310. The worker secures the base assembly 150 to the fixture 200, for example at the top surface 202. With reference to FIG. 2, the fasteners 180 and 181 may be inserted through the openings 174 and 176 of the base plate 160 and the base plate 160 placed on the top surface 202. Alternatively, the fasteners 180 and 181 may be preinstalled and the assembly placed on the top surface 202. The worker may insert the fasteners 210 through the openings 172 of the base plate 160 and into the fixture 200 to further secure the base plate 150 to the fixture 200. Alternatively, the worker may weld the base plate 160 (and in some examples also the fasteners 180 and 181) onto the fixture surface 202. It will be appreciated that step of installing the mounting plate 110 onto support structure 300 and the step of installing base assembly 150 onto fixture 200 may be performed in any order. It will also be appreciated that the base plate 160 and the fasteners 180 and 181 may be pre-installed on the fixture 200 so that the worker need not perform this step.

After the mounting plate 110 is attached to the support structure 300 and the base assembly 150 is attached to the fixture 200, the worker may mount the fixture 200 onto the support structure 300. To do so, the worker may insert the top portion 182 of the fasteners 180 and 181 into the mounting aperture 140 of the mounting plate. The worker may then assert moderate force to push the middle portion 184 of the fasteners 180 and 181 through the mounting aperture 140. Once the middle portion 184 is through the mounting aperture 140, the worker may release the fixture 200, and the fixture 200 will be coupled to the support structure 300.

It should be appreciated that electrical wires of the fixture 200 may be connected to electricity-providing wires from the support structure 300 before the fixture 200 is coupled to the support structure 300. The worker may also use welding in lieu of any fasteners.

A method to install a fixture to a support structure using a hanger bracket mount assembly 350 shown in FIGS. 6-9 is discussed below. A worker may install the fasteners 700 and the base plate 600 on the top surface 802 of the fixture 800 in a manner similar to the base plate 160 and fasteners 180 and 181 discussed above with respect to FIGS. 1-5. With reference to FIG. 7, the plurality of fastening members 500 may be inserted into the plurality of openings 410 disposed on the mounting plate 400 to assemble the hanger bracket assembly 380. The worker may use the fasteners 430 and the nuts 440 to secure the fastening members 500 in place. It should be appreciated that the hanger bracket assembly 380 may be preassembled, and the worker need not construct the hanger bracket assembly 380. The fasteners 430 and nuts 440 may be replaced by welding or other attachment mechanisms.

The worker may couple the hanger bracket assembly 380 to the support structure 1000, which may be a recessed light receptacle. To do so, the worker may insert the plurality of fastening members 500 into the plurality of openings 1012 located respectively on the plurality of securing mechanisms 1010. The worker may place the middle portions 504 of each fastening member 500 above the openings 1012 so that the angle joints 505 may latch onto the edges of the opening 1012. The worker may insert the fasteners 700 into the mounting aperture 450 of the mounting plate 400 to couple the fixture 800 to the support structure 1000 in a manner similar to the fasteners 180 and 181 insertion into mounting aperture 140 discussed above in relation to FIGS. 1-5. It will be appreciated that the hanger bracket assembly 380 need not be installed on the support member 1000 prior to the bracket mount assembly 350 coupled to the fasteners 700. In a particular example, the worker may insert the fasteners 700 into the mounting aperture 450 on the mounting plate 400 before inserting the fastening members 500 into openings 1012. The step of securing the hanger bracket assembly 380 to the support structure 1000 and of coupling the hanger bracket assembly 380 to the fasteners 700 may be performed in any order because the worker can easily locate the openings 1012 by feel even if the fixture 800 obstructs their view of openings 1012.

While any discussion of or citation to related art in this disclosure may or may not include some prior art references, applicant neither concedes nor acquiesces to the position that any given reference is prior art or analogous prior art.

The foregoing description, for purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to explain the principles of the invention and its practical applications, to thereby enable others skilled in the art to utilize the invention and various embodiments with various modifications as are suited to the particular use contemplated.

What is claimed is:

1. A bracket mount assembly, comprising:
   a mounting plate including a mounting aperture, the mounting aperture having an aperture cross-sectional width; and
   a base assembly including a first fastener and a second fastener, wherein
   a first width is defined as a width between the first and second fasteners proximal to a first end of a primary fastener,
   a second width is defined as a width between the first and second fasteners proximal to a second, opposing end of the primary fastener,
   a third width is defined as a width between the first and second fasteners at a point between the first and second ends of the primary fastener, and
   the third width is greater than each of the first width, the second width and the aperture cross-sectional width.

2. The bracket mount assembly of claim 1, further comprising a base plate that secures the first and second fasteners to a fixture.

3. The bracket mount assembly of claim 2, wherein the first and second fasteners are disposed through at least one opening on the base plate.

4. The bracket mount assembly of claim 2, wherein an end portion of the first fastener and an end portion of the second fastener are secured onto the base plate.

5. The bracket mount assembly of claim 1, wherein the base assembly is coupled to the mounting plate by the first and second fasteners being disposed through the mounting aperture.

6. The bracket mount assembly of claim 1, further comprising
   a support structure coupled to the mounting plate;
   at least one first opening disposed at a first end of the mounting plate;
   at least one second opening disposed at a second end of the mounting plate; and
   a plurality of support structure fasteners respectively disposed through the at least one first opening and the at least one second opening to couple the mounting plate to the support structure.

7. The bracket mount assembly of claim 6, wherein the support structure includes an electrical outlet box.

8. The bracket mount assembly of claim 1, wherein the mounting plate includes a grounding mechanism.

9. A bracket mount assembly, comprising:
   a base assembly including a first fastener, a second fastener, and a base plate that couples to a fixture;
   a mounting plate including a first fastening member, a second fastening member and a mounting aperture disposed between the first and second fastening members; and
   a support structure including a plurality of securing mechanisms, wherein
   a cross-sectional width of the mounting aperture is less than a width between the first and second fasteners,
   the fastening members respectively include a top portion, a middle portion, and a bottom portion,
   the top portion has a top width, the middle portion has a middle width, and the bottom portion has a bottom width,
   the middle width is greater than each of the top width and the bottom width, and
   the securing mechanism respectively having an opening with a width smaller than the middle widths of the fastening members.

10. The bracket mount assembly of claim 9, wherein the mounting plate is coupled to the support structure by the fastening members respectively disposed through the openings of the securing mechanisms.

11. The bracket mount assembly of claim 9, wherein the support structure includes a recessed light housing.

12. The bracket mount assembly of claim 9, wherein the fastening member includes a bent wire.

13. A bracket mount assembly, comprising:
   a base assembly including a first fastener, a second fastener, and a base plate that couples to a fixture; and
   a mounting plate including a first fastening member, a second fastening member and a mounting aperture disposed between the first and second fastening members, wherein
   a cross-sectional width of the mounting aperture is less than a width between the first and second fasteners,
   the fastening members respectively include a top portion, a middle portion, and a bottom portion,
   the top portion has a top width, the middle portion has a middle width, and the bottom portion has a bottom width,
   the middle width is greater than each of the top width and the bottom width, and
   the middle portions of the fastening members respectively include outwardly protruding sections.

14. A method, comprising:
   providing a base assembly having a first fastener and a second fastener;
   providing a hanger assembly having a first fastener, a second fastener, and a mounting aperture with an aperture cross-sectional width;
   coupling the first and second fasteners of the hanger assembly to a support structure; and coupling the base assembly to the hanger assembly by inserting the first and second fasteners of the base assembly into the mounting aperture of the hanger assembly;

coupling a first angled joint of the first fastener to a first opening of the support structure; and coupling a second angled joint of the second fastener to a second opening of the support structure.

15. The method of claim 14, wherein the first and second fastener of the base assembly respectively include a top portion, a middle portion, and a bottom portion, the top portion has a top width, the middle portion has a middle width, and the bottom portion has bottom width, and the middle width is greater than each of the top width, the bottom width, and the aperture cross-sectional width of the mounting aperture.

16. The method of claim 14, wherein the coupling the first and second fasteners of the hanger assembly to the support structure is performed before the coupling the base assembly to the hanger assembly.

17. The method of claim 14, wherein the coupling the base assembly to the hanger assembly is performed before the coupling the first and second fasteners of the hanger assembly to the support structure.

18. The method of claim 14, wherein the coupling the first and second fasteners of the hanger assembly to the support structure includes coupling the first and second fasteners to a recessed light receptacle.

\* \* \* \* \*